(12) United States Patent
Adam et al.

(10) Patent No.: US 9,917,032 B2
(45) Date of Patent: Mar. 13, 2018

(54) CONDUCTIVE THERMAL COMPOSITIONS, USES THEREOF, AND METHODS FOR THEIR PREPARATION

(71) Applicant: EMPIRE TECHNOLOGY DEVELOPMENT LLC, Wilmington, DE (US)

(72) Inventors: Georgius Abidal Adam, Edensor Park (AU); Mordehai Margalit, Zichron Yaaqov (IL)

(73) Assignee: Empire Technology Development LLC, Wilmington, DE (US)

( * ) Notice: Subject to any disclaimer, the term of this patent is extended or adjusted under 35 U.S.C. 154(b) by 566 days.

(21) Appl. No.: 14/449,074

(22) Filed: Jul. 31, 2014

(65) Prior Publication Data
US 2016/0033213 A1    Feb. 4, 2016

(51) Int. Cl.
*C09K 5/14*   (2006.01)
*H01L 23/373*   (2006.01)

(52) U.S. Cl.
CPC ............ *H01L 23/3737* (2013.01); *C09K 5/14* (2013.01); *H01L 2924/0002* (2013.01)

(58) Field of Classification Search
CPC ...................................................... C09K 5/14
See application file for complete search history.

(56) References Cited

U.S. PATENT DOCUMENTS 4,627,859 A * 12/1986 Zupancic ............. B01D 69/142
210/490
2009/0030120 A1    1/2009 Zijp et al.

FOREIGN PATENT DOCUMENTS

JP    H0481469 A    3/1992
JP    2513487 B2 *  7/1996 ........... G03G 5/0696

OTHER PUBLICATIONS

Keyanpour-Rad, M. "Synthesis of a functionalized insoluble polystyrene-bound zinc(II)phthalocyanine and the metal free resin" Iran. Polym. J. 2001, 10, 223-228.*

Shaposhnikov et al. "Synthesis and Properties of Extracomplexes of Tetrasubstitued Phthalocyanines" Russ. J. Org. Chem. 2005, 75, 1830-1839.*
Zhang et al. "Luminescence. A Sensitive Fluorimetric Method for the Determination of Nitrite and Nitrate in Seawater by a Novel Red-Region Fluorescence Dye." Anal. Lett. 2001, 34, 2761-2770.*
English translation of JP 2513487 B2 Abstract, retrieved on Aug. 2, 2017 from Espacenet.com.*
Partial English translation of JP 2513487 B2 at col. 3:23-26, John DiNatale, USPTO, Alexandria, VA (Aug. 2017).*
Alzeer et al., An efficient two-step synthesis of metal-free phthalocyanines using a Zn(II) template, Chemical Communications, (15) pp. 1970-1971 (2009).
Aluminium nitride, http://en.wikipedia.org/wiki/Aluminium_nitride, May 12, 2014.
Janssen et al., Thermally-conductive plastics: balancing material properties with application needs, *Compounding World* (Feb. 2010), pp. 38-42.
Lu et al., Aluminum phthalocyanine complex covalently bonded to MCM-41 silica as heterogeneous catalyst for the synthesis of cyclic carbonates, *Journal of Molecular Catalysis A: Chemical*, (Jul. 2002), 186(1-2):33-42.
Saravanan et al., Dielectric and Conductivity Studies on Cobalt Phthalocyanine Tetramers, *Journal of Applied Polymer Sciences* (2004), 91:2529-2535.
Sauls et al., Coordination compounds of aluminum as precursors to aluminium nitride, *Coordination Chemistry Reviews*, (1993), 128:193-207.
Sherman, Hot topic: adding thermal conductivity to plastics, *Compounding World* (Feb. 2010), pp. 28-36.
Thermal Conductivity, http://hyperphysics.phy-astr.gsu.edu/hbase/tables/thron.html (Jul. 9, 2014), pp. 1-3.
Thomas, Electro-Optical Properties of Metal Phthalocyanines and Naphthalocyanines, Department of Applied Chemistry, Cochin University of Science and Technology, Kochi, India.(Dec. 1995).
Xu et al., Increasing the thermal conductivity of boron nitride and aluminum nitride particle epoxy-matrix composites by particle surface treatments, *Composite Interfaces*, (2000), 7(4):243-256.
Xu et al., Thermally conducting aluminum nitride polymer-matrix composites, *Composites: Part A* (2001), 32:1749-1757.

* cited by examiner

*Primary Examiner* — Amanda L Aguirre
(74) *Attorney, Agent, or Firm* — Pepper Hamilton LLP

(57) ABSTRACT

Thermal conductive compositions, methods for their preparation, and use are provided, which include, for example, as thermal sinks, heat transfer systems, and other uses.

10 Claims, No Drawings

CONDUCTIVE THERMAL COMPOSITIONS, USES THEREOF, AND METHODS FOR THEIR PREPARATION

BACKGROUND

A thermal sink that uses a thermal conductive matrix is one of the common requirements for electronic applications to dissipate the heat generated during operation of the encapsulated microelectronics in the polymer matrix. Metals can act as good thermal conductors, however, because they are also good electrical conductors they are not very useful as thermal sinks. On the other hand, polymer matrices can act as electrical insulators but are very poor thermal conductors and accordingly when the temperature rises the polymer will thermally decompose and not function as a thermal sink.

Accordingly, there is a need for compositions that can function as thermal sinks with better properties than what are currently available. The present disclosure overcomes at least some, or all of the disadvantages of previous compositions as well as provides other advantages as discussed herein.

SUMMARY

In some embodiments, thermal conductive compositions are provided, the compositions comprising a compound of Formula (I)

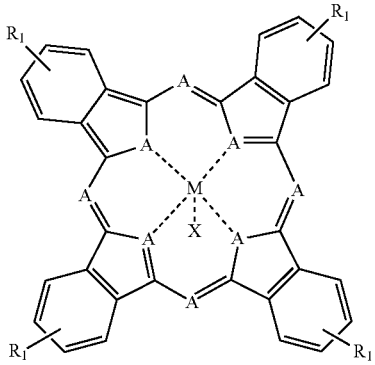

wherein:
A is N or P;
M is Al, B, Si, Co, Ni, Zn, or In;
X is absent, alkyl, or halo;
$R_1$ is —C(=O)O$R_2$, —C(=O)OCH$_2$CH(O)CH$_2$, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

In some embodiments, the composition comprises a siloxane derivative of a compound of Formula (I). In some embodiments, the siloxane derivative is a compound of Formula (II):

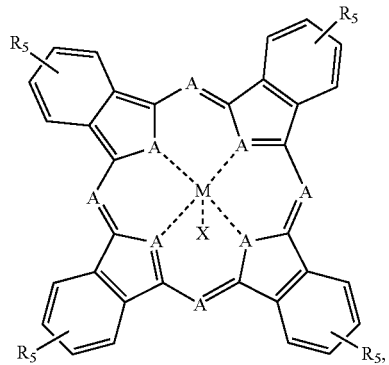

wherein
$R_5$ is: —OCN, or

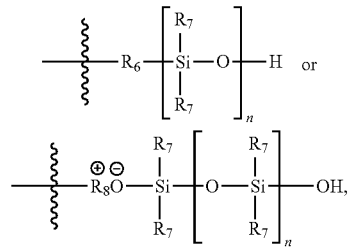

wherein
$R_6$ is —C(=O)O—, —C(=O)OCH$_2$C(OH)HCH2-, —CH$_2$C(OH)HCH$_2$—, —NH—, —Si($R_2$)$_2$CH$_2$CH$_2$NH—, —Si($R_2$)$_2$CH$_2$C(OH)HCH$_2$—, —CH$_2$CH$_2$—, —CH$_2$CH$_2$CH$_2$—, —CH$_2$O—, —CH$_2$—, and
$R_8$ is —N$^+$($R_9$)$_3$, wherein $R_9$ is $C_1$-$C_6$ alkyl.

In some embodiments, the composition is a polyolefin copolymerized or grafted with a compound of Formula (I). In some embodiments, the polyolefin copolymerized or grafted with a compound of Formula (I) has a formula of:

wherein:
$G_1$ is polyalkylene or polyvinyl alcohol;
$R_1$ is $C_1$-$C_6$ alkyl or —COO—;

A is N or P;

M is Al, B, Si, Co, Ni, Zn, or In; and

X is absent, alkyl, or halo.

In some embodiments, A heat sink are provided comprising a compound of Formula (I)

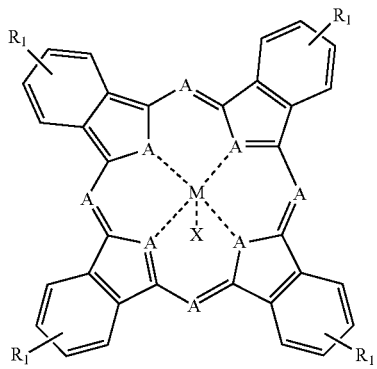

(I)

wherein:

A is N or P;

M is Al, B, Si, Co, Ni, Zn, or In;

X is absent, alkyl, or halo;

$R_1$ is —C(=O)O$R_4$, —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, —OCN, —CH$_2$OH, —CH$_2$Z, CH$_2$OCN, —S$R_3$, —N$^+$(CH)$_3$$^-$OH, hydroxyl, or a siloxane derivative thereof.

Z is halo;

$R_2$ is $C_1$-$C_6$ alkyl;

$R_3$ is H, $C_1$-$C_6$ alkyl, or $C_1$-$C_6$ alkenyl; and $R_4$ is H, $C_1$-$C_6$ alkyl, or $C_1$-$C_6$ alkenyl.

In some embodiments, the heat sink comprises a composition that comprises a siloxane derivative of a compound of Formula (I). In some embodiments, the siloxane derivative is a compound of Formula (II):

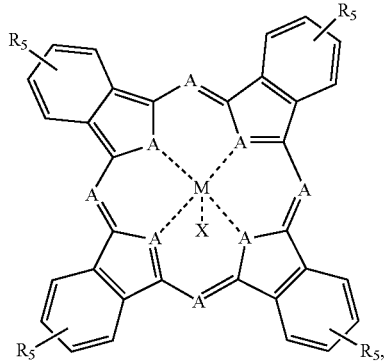

(II)

wherein $R_5$ is: —OCN,

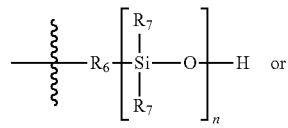

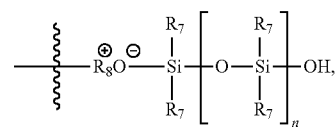

wherein $R_6$ is —C(=O)O—, —C(=O)OCH$_2$C(OH)HCH2-, —CH$_2$C(OH)HCH$_2$—, —NH—, —Si($R_2$)$_2$CH$_2$CH$_2$NH—, —Si($R_2$)$_2$CH$_2$C(OH)HCH$_2$—, —CH$_2$CH$_2$—, —CH$_2$CH$_2$CH$_2$—, —CH$_2$O—, —CH$_2$—;

$R_8$ is —N$^+$($R_9$)$_3$, wherein $R_9$ is $C_1$-$C_6$ alkyl, and n is 1-100.

In some embodiments, the composition is a polyolefin copolymerized or grafted with a compound of Formula (I). In some embodiments, the polyolefin copolymerized or grafted with a compound of Formula (I) has a formula of:

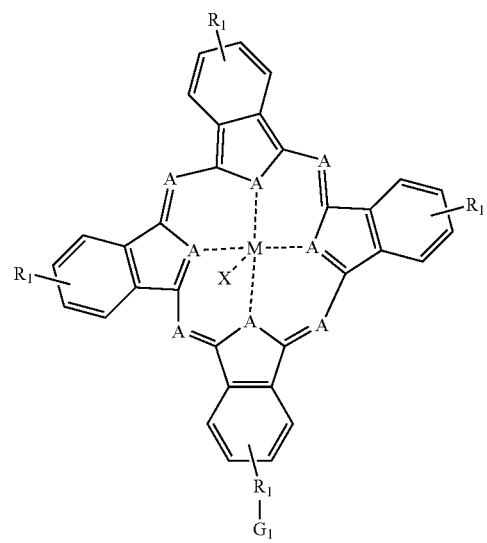

wherein:

$G_1$ is polyalkylene or polyvinyl alcohol;

$R_1$ is $C_1$-$C_6$ alkyl or —COO—;

A is N or P;

M is Al, B, Si, Co, Ni, Zn, or In; and

X is absent, alkyl, or halo.

In some embodiments, heat transfer systems are provided comprising at least one heat source; at least one heat sink; and at least one thermal conductive composition comprising a compound of Formula (I)

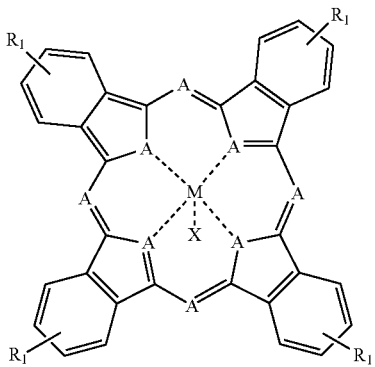
(I)

wherein:
A is N or P;
M is Al, B, Si, Co, Ni, Zn, or In;
X is absent, alkyl, or halo;
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, —OCN, —CH$_2$OH, —CH$_2$Z, CH$_2$OCN, —S$R_3$, —N$^+$(CH3)$_3^-$OH, hydroxyl, or any reactive siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl;
wherein at least a portion of the thermal conductive composition is positioned substantially between the heat source and the heat sink and provides thermal communication between the heat source and heat sink.

In some embodiments, electronic devices are provided, wherein the electronic device is at least partially encapsulated by a thermal conductive composition comprising a compound of Formula (I)

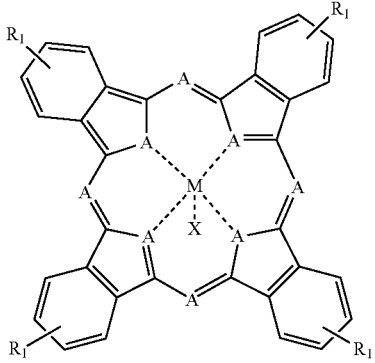
(I)

wherein:
A is N or P;
M is Al, B, Si, Co, Ni, Zn, or In;
X is absent, alkyl, or halo;
$R_1$ is —C(=O)O$R_4$, —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, —OCN, —CH$_2$OH, —CH$_2$Z, CH$_2$OCN, —Si(O$R_3$)$_3$, —N$^+$(CH3)$_3^-$OH, hydroxyl, or any reactive siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

In some embodiments, methods of preparing a compound of Formula (I) are provided. In some embodiments, the method comprises contacting

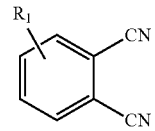

with a metal salt under conditions sufficient to produce a compound of Formula (I)

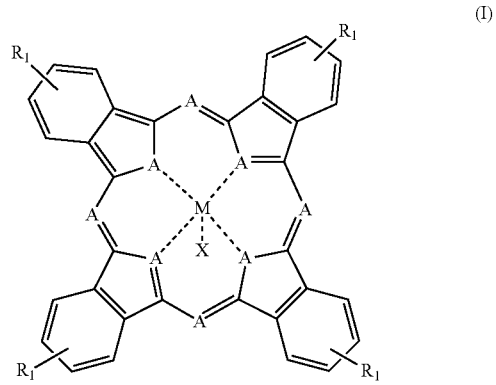
(I)

wherein:
A is N;
M is Al, B, Si, Co, Ni, Zn, or In;
X is absent, alkyl, or halo;
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

In some embodiments, the method comprises:
a) contacting

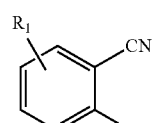

with lithium and an alcohol under conditions sufficient to produce a compound of Formula (IA)

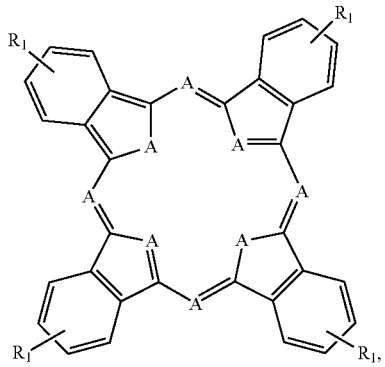

(IA)

wherein A is N;

R₁ is —C(=O)OR₂, —C(=O)OCH₂CH(O)CH2, —CH₂CH(O)CH₂, —NH₂, —Si(OR₂)₃, —Si(R₂)₂CH₂CH₂NH₂, —Si(R₂)₂CH₂CH(O)CH₂, —CH=CH₂, —CH₂CH=CH₂, —CH=CH—CN, OCN, —CH₂OH, —CH₂Z, CH₂OCN hydroxyl, or a siloxane derivative thereof.

Z is halo;
R₂ is C₁-C₆ alkyl;
R₃ is H, C₁-C₆ alkyl, or C₁-C₆ alkenyl; and
R₄ is H, C₁-C₆ alkyl, or C₁-C₆ alkenyl; and b) contacting the compound of Formula (IA) with a metal salt under conditions sufficient to form a compound of Formula (I)

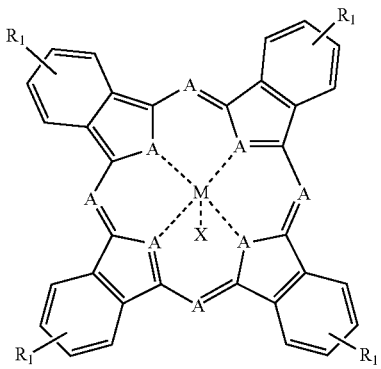

(I)

wherein:

A is N;
M is Al, B, Si, Co, Ni, Zn, or In;
X is absent, alkyl, or halo;
R₁ is —C(=O)OR₂, —C(=O)OCH₂CH(O)CH2, —CH₂CH(O)CH₂, —NH₂, —Si(OR₂)₃, —Si(R₂)₂CH₂CH₂NH₂, —Si(R₂)₂CH₂CH(O)CH₂, —CH=CH₂, —CH₂CH=CH₂, —CH=CH—CN, OCN, —CH₂OH, —CH₂Z, CH₂OCN hydroxyl, or a siloxane derivative thereof.

Z is halo;
R₂ is C₁-C₆ alkyl;
R₃ is H, C₁-C₆ alkyl, or C₁-C₆ alkenyl; and
R₄ is H, C₁-C₆ alkyl, or C₁-C₆ alkenyl.

In some embodiments, methods of preparing a compound of Formula (III) are provided.

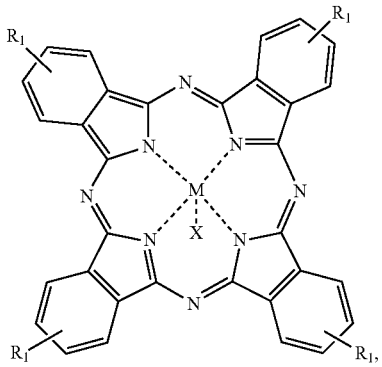

(III)

wherein
M is Al, B, Si, Co, Ni, Zn, or In;
X is absent, alkyl, or halo;
R₁ is —C(=O)OR₂, —C(=O)OCH₂CH(O)CH2, —CH₂CH(O)CH₂, —NH₂, —Si(OR₂)₃, —Si(R₂)₂CH₂CH₂NH₂, —Si(R₂)₂CH₂CH(O)CH₂, —CH=CH₂, —CH₂CH=CH₂, —CH=CH—CN, OCN, —CH₂OH, —CH₂Z, CH₂OCN hydroxyl, or a siloxane derivative thereof.

Z is halo;
R₂ is C₁-C₆ alkyl;
R₃ is H, C₁-C₆ alkyl, or C₁-C₆ alkenyl; and
R₄ is H, C₁-C₆ alkyl, or C₁-C₆ alkenyl. In some embodiments, the method comprises contacting a compound of formula

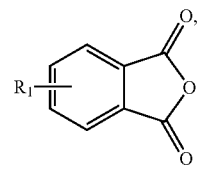

wherein
R₁ is —C(=O)OR₂, —C(=O)OCH₂CH(O)CH2, —CH₂CH(O)CH₂, —NH₂, —Si(OR₂)₃, —Si(R₂)₂CH₂CH₂NH₂, —Si(R₂)₂CH₂CH(O)CH₂, —CH=CH₂, —CH₂CH=CH₂, —CH=CH—CN, OCN, —CH₂OH, —CH₂Z, CH₂OCN hydroxyl, or a siloxane derivative thereof.

Z is halo;
R₂ is C₁-C₆ alkyl;
R₃ is H, C₁-C₆ alkyl, or C₁-C₆ alkenyl; and
R₄ is H, C₁-C₆ alkyl, or C₁-C₆ alkenyl, with urea, the metal M, wherein M is Al, B, Si, Co, Ni, Zn, or In, and nitrobenzene under conditions sufficient to produce a compound of Formula (III).

In some embodiments, the method comprises contacting the compound of formula

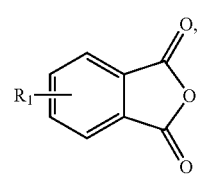

urea, M and nitrobenzene in the presence of Mo₇(NH₄)₆O₂₄.

In some embodiments, methods of preparing a metal-free phthalocyanine, the method comprising contacting a metal-phthalocyanine of Formula (III)

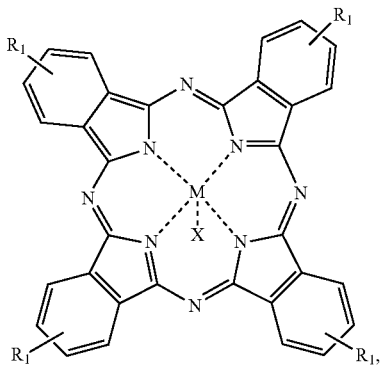

(III)

wherein
M is Al, B, Si, Co, Ni, Zn, or In;
X is absent, alkyl, or halo;
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl,
with pyridine hydrochloride to form a compound a metal-free phthalocyanine of Formula (IV)

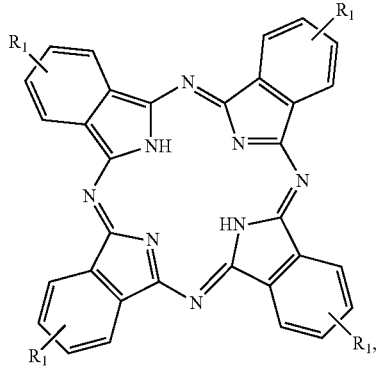

(IV)

wherein
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

DETAILED DESCRIPTION

This description is not limited to the particular processes, compositions, or methodologies described, as these may vary. The terminology used in the description is for the purpose of describing the particular versions or embodiments only, and it is not intended to limit the scope of the embodiments described herein. Unless defined otherwise, all technical and scientific terms used herein have the same meanings as commonly understood by one of ordinary skill in the art. In some cases, terms with commonly understood meanings are defined herein for clarity and/or for ready reference, and the inclusion of such definitions herein should not necessarily be construed to represent a substantial difference over what is generally understood in the art. However, in case of conflict, the patent specification, including definitions, will prevail.

It must also be noted that as used herein and in the appended claims, the singular forms "a", "an", and "the" include plural reference unless the context clearly dictates otherwise.

As used herein, the term "alkyl" means a saturated or unsaturated hydrocarbon group which is straight-chained or branched. An unsaturated alkyl group refers to an alkyl group that contains at least one double bond, which can also be referred to as an "alkenyl." The alkyl chain can also be substituted. An alkyl group can contain from 1 to 24, from 1 to 22, from 1 to 20, from 1 to 18, from 1 to 16, from 1 to 14, from 1 to 12, from 2 to 20, from 1 to 10, from 2 to 10, from 1 to 8, from 2 to 8, from 1 to 6, from 2 to 6, from 1 to 4, from 2 to 4, from 1 to 3, or 2 or 3 carbon atoms. Examples of alkyl groups include, but are not limited to, methyl (Me), ethyl (Et), propyl (for example, n-propyl and isopropyl), butyl (for example, n-butyl, t-butyl, isobutyl), pentyl (for example, n-pentyl, isopentyl, neopentyl), hexyl, isohexyl, heptyl, 4,4 dimethylpentyl, octyl, 2,2,4-trimethylpentyl, nonyl, decyl, undecyl, dodecyl, 2-methyl-1-propyl, 2-methyl-2-propyl, 2-methyl-1-butyl, 3-methyl-1-butyl, 2-methyl-3-butyl, 2-methyl-1-pentyl, 2,2-dimethyl-1-propyl, 3-methyl-1-pentyl, 4-methyl-1-pentyl, 2-methyl-2-pentyl, 3-methyl-2-pentyl, 4-methyl-2-pentyl, 2,2-dimethyl-1-butyl, 3,3-dimethyl-1-butyl, 2-ethyl-1-butyl, and the like.

As used herein, the phrase "$C_1$-$C_{24}$ alkyl, optionally comprising at least one alkenyl group" refers to a $C_1$-$C_{24}$ alkyl carbon chain that can have at least one alkenyl group located anywhere in the chain. When the $C_1$-$C_{24}$ alkyl carbon chain has at least one alkenyl group, the length of the $C_1$-$C_{24}$ alkyl carbon chain is at least two carbons. When present, the carbons in the alkenyl group are counted as carbons in the $C_1$-$C_{24}$ alkyl carbon chain.

As used herein, the term "alkenyl" means a straight or branched alkyl group having one or more double carbon-carbon bonds and 2-20 carbon atoms, including, but not limited to, ethylenyl (vinyl), 1-propenyl, 2-propenyl, 2-methyl-1-propenyl, 1-butenyl, 2-butenyl, and the like. In some embodiments, the alkenyl chain is from 2 to 24 carbon atoms in length, from 2 to 22 carbon atoms in length, from 2 to 20 carbon atoms in length, from 2 to 18 carbon atoms in length, from 2 to 16 carbon atoms in length, from 2 to 14 carbon atoms in length, from 2 to 12 carbon atoms in length, from 2 to 10 carbon atoms in length, from 2 to 8 carbon atoms in length, from 2 to 6 carbon atoms in length, or from 2 to 4 carbon atoms in length. In some embodiments, the alkenyl group has 1, 2, 3, 4, 5, or 6 double bonds.

As used herein, the term "polyalkylene," which can also be referred to as a polyolefin, refers to polymeric groups including, but not limited to, polypropylene, polyethylene, polymethylpentene, polybutene, and the like.

As used in this document, terms "comprise," "have," and "include" and their conjugates, as used herein, mean "including but not limited to." While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

Embodiments disclosed herein provide new thermal conductive compositions that can act, for example, as heat sinks and/or be used in heat transfer systems In some embodiments, thermal conductive compositions comprising a compound of Formula (I)

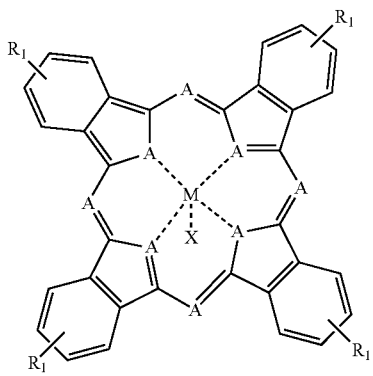

wherein:
A is N or P;
M is Al, B, Si, Co, Ni, Zn, or In;
X is absent, alkyl, or halo;
$R_1$ is —C(=O)$OR_2$, —C(=O)$OCH_2CH(O)CH2$, —$CH_2CH(O)CH_2$, —$NH_2$, —Si(O$R_2$)$_3$, —Si($R_2$)$_2$$CH_2CH_2NH_2$, —Si($R_2$)$_2$$CH_2CH(O)CH_2$, —CH=$CH_2$, —$CH_2$CH=$CH_2$, —CH=CH—CN, OCN, —$CH_2$OH, —$CH_2$Z, $CH_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl are provided.

In some embodiments, $R_1$ is —C(=O)$OR_2$, —C(=O)$OCH_2CH(O)CH_2$, —$NH_2$, $CH_2$=CH—, $CH_2$=CH—$CH_2$—, —Si(O$R_3$)$_3$, or a reactive siloxane derivative thereof.

In some embodiments, $R_1$ is hydroxyl, —C(=O)OH, OCN, or —C(=O)$OR_2$.

In some embodiments, $R_1$ is —Si(O$R_3$)$_3$.

In some embodiments, A is N. In some embodiments, A is P.

In some embodiments, M is Al or Zn.

In some embodiments, X is Cl or I.

In some embodiments, Z is chloro.

In some embodiments of the thermal conductive composition, the composition comprising a compound of Formula (I), A is N, M is Zn, X is absent, and the other variables are as above. In some embodiments, $R_1$ is —Si(O$R_3$)$_3$. In some embodiments, $R_1$ is —OH, —C(=O)$OR_2$, or —OCN.

In some embodiments of the thermal conductive composition, the composition comprises a siloxane derivative of a compound of Formula (I). In some embodiments, the siloxane derivative is a compound of Formula (II):

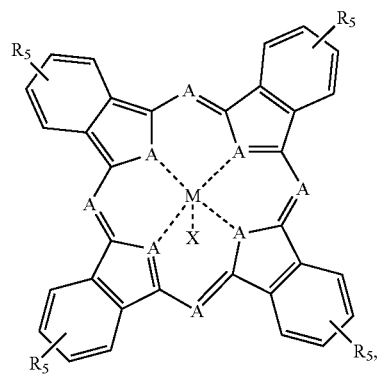

wherein
$R_5$ is: —OCN, or

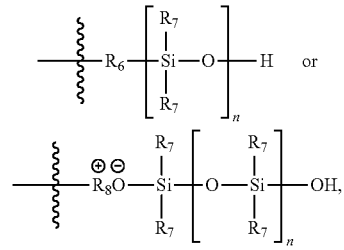

wherein
$R_6$ is —C(=O)O—, —C(=O)$OCH_2C(OH)HCH2$-, —$CH_2C(OH)HCH_2$—, —NH—, —Si($R_2$)$_2$$CH_2CH_2NH$—, —Si($R_2$)$_2$$CH_2C(OH)HCH_2$—, —$CH_2CH_2$—, —$CH_2CH_2CH_2$—, —$CH_2$O—, —$CH_2$—, and
$R_8$ is —$N^+$($R_9$)$_3$, wherein $R_9$ is $C_1$-$C_6$ alkyl.

In some embodiments of the thermal conductive composition, the composition is a polyolefin copolymerized or grafted with a compound of Formula (I). In some embodiments, the polyolefin copolymerized or grafted with a compound of Formula (I) has a formula of:

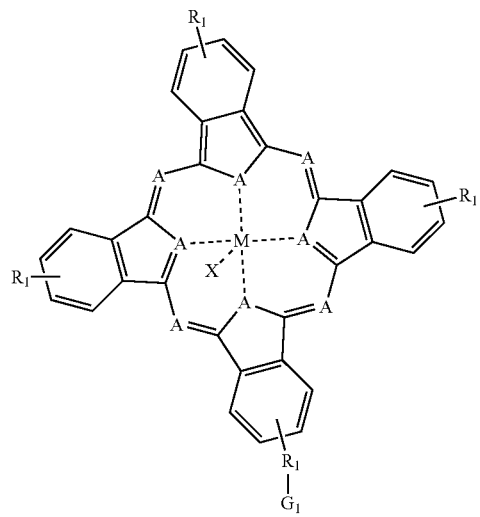

wherein:
$G_1$ is polyalkylene or polyvinyl alcohol;
$R_1$ is $C_1$-$C_6$ alkyl or —COO—;
A is N or P;

M is Al, B, Si, Co, Ni, Zn, or In; and

X is absent, alkyl, or halo.

In some embodiments, $G_1$ is polypropylene, polyethylene, polymethylpentene, or polybutene.

In some embodiments, the thermal conductive composition described herein has a thermal conductivity of about 10 W/(m·K) to about 50 W/(m·K).

Heat sinks are also provided by embodiments disclosed herein. A heat sink can be a passive heat exchanger that cools a device by dissipating heat into the surrounding medium. In some embodiments, a heat sink comprising a compound of Formula (I)

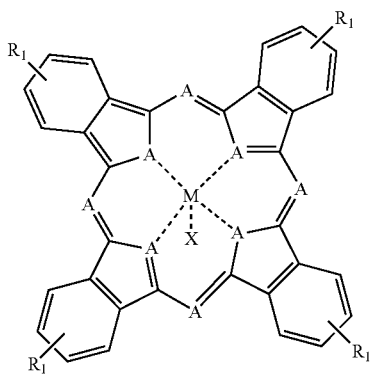

(I)

wherein:

A is N or P;

M is Al, B, Si, Co, Ni, Zn, or In;

X is absent, alkyl, or halo;

$R_1$ is —C(=O)OR$_4$, —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, —OCN, —CH$_2$OH, —CH$_2$Z, CH$_2$OCN, —SR$_3$, —N$^+$(CH)$_3$$^-$OH, hydroxyl, or a siloxane derivative thereof.

Z is halo;

$R_2$ is $C_1$-$C_6$ alkyl;

$R_3$ is H, $C_1$-$C_6$ alkyl, or $C_1$-$C_6$ alkenyl; and $R_4$ is H, $C_1$-$C_6$ alkyl, or $C_1$-$C_6$ alkenyl is provided.

In some embodiments of the heat sink, $R_1$ is —C(=O)OR$_4$, —C(=O)OCH$_2$CH(O)CH$_2$, —NH$_2$, CH$_2$=CH—, CH$_2$=CH—CH$_2$—, —Si(R$_3$)$_3$, or a siloxane derivative thereof. In some embodiments, $R_1$ is hydroxyl, —C(=O)OH, —OCN, or —C(=O)OR$_4$. In some embodiments, $R_1$ wherein $R_1$ is —Si(R$_3$)$_3$. In some embodiments, A is N or P. In some embodiments of the heat sink, M is Al or Zn. In some embodiments, X is chloro or iodo. In some embodiments, Z is chloro. In some embodiments, $G_1$ is polypropylene, polyethylene, polymethylpentene, or polybutene.

In some embodiments of the heat sink, the composition comprising a compound of Formula (I), wherein A is N, M is Zn, X is absent, and the other variables are as above. In some embodiments, $R_1$ is —Si(OR$_3$)$_3$. In some embodiments, $R_1$ is —OH, —C(=O)OR$_4$, or —OCN.

In some embodiments of the heat sink, the composition comprises a siloxane derivative of a compound of Formula (I). In some embodiments of the heat sink, the siloxane derivative is a compound of Formula (II):

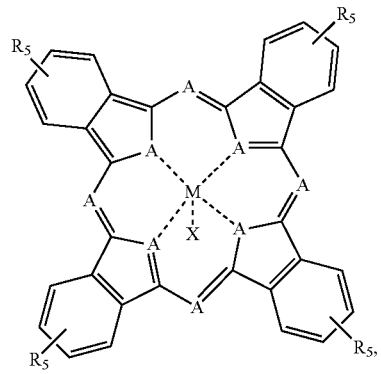

(II)

wherein $R_5$ is: —OCN,

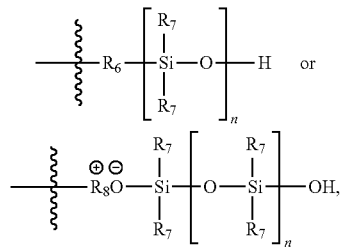

wherein $R_6$ is —C(=O)O—, —C(=O)OCH$_2$C(OH)HCH2-, —CH$_2$C(OH)HCH$_2$—, —NH—, —Si(R$_2$)$_2$CH$_2$CH$_2$NH—, —Si(R$_2$)$_2$CH$_2$C(OH)HCH$_2$—, —CH$_2$CH$_2$—, —CH$_2$CH$_2$CH$_2$—, —CH$_2$O—, —CH$_2$—;

$R_8$ is —N$^+$(R$_9$)$_3$, wherein $R_9$ is $C_1$-$C_6$ alkyl, and n is 1-100.

In some embodiments of the heat sink, the composition is a polyolefin copolymerized or grafted with a compound of Formula (I). In some embodiments, the polyolefin copolymerized or grafted with a compound of Formula (I) has a formula of:

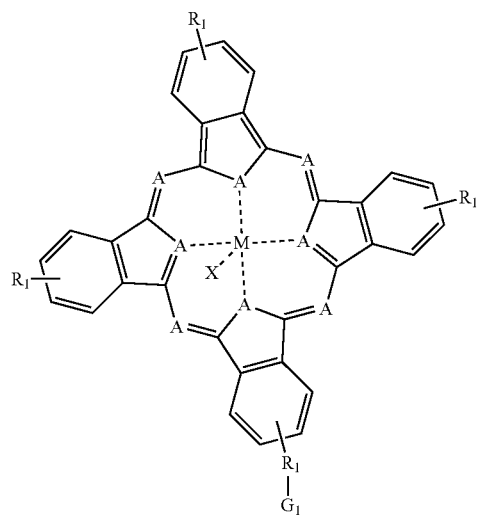

wherein:

$G_1$ is polyalkylene or polyvinyl alcohol;

$R_1$ is $C_1$-$C_6$ alkyl or —COO—;

A is N or P;

M is Al, B, Si, Co, Ni, Zn, or In; and

X is absent, alkyl, or halo.

In some embodiments, the heat sink is capable of transferring 40-50 W/mK. In some embodiments, $G_1$ is polypropylene, polyethylene, polymethylpentene, or polybutene.

Embodiments disclosed herein also provide for heat transfer systems. In some embodiments, a heat transfer system comprises at least one heat source, at least one heat sink; and, at least one thermal conductive composition comprising a compound of Formula (I)

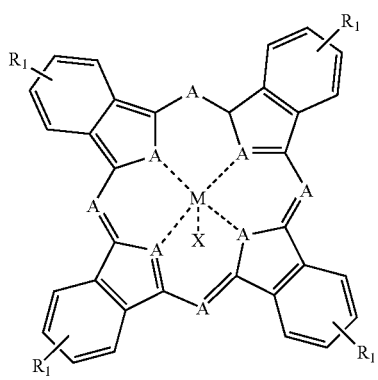

(I)

wherein:

A is N or P;

M is Al, B, Si, Co, Ni, Zn, or In;

X is absent, alkyl, or halo;

$R_1$ is —C(=O)$OR_2$, —C(=O)$OCH_2$CH(O)$CH_2$, —$CH_2$CH(O)$CH_2$, —$NH_2$, —Si$(OR_2)_3$, —Si$(R_2)_2$$CH_2$$CH_2$$NH_2$, —Si$(R_2)_2$$CH_2$CH(O)$CH_2$, —CH=$CH_2$, —$CH_2$CH=$CH_2$, —CH=CH—CN, —OCN, —$CH_2$OH, —$CH_2$Z, $CH_2$OCN, —$SR_3$, —$N^+$$(CH3)_3$$^-$OH, hydroxyl, or any reactive siloxane derivative thereof.

Z is halo;

$R_2$ is $C_1$-$C_6$ alkyl;

$R_3$ is H, $C_1$-$C_6$ alkyl, or $C_1$-$C_6$ alkenyl; and $R_4$ is H, $C_1$-$C_6$ alkyl, or $C_1$-$C_6$ alkenyl.

wherein at least a portion of the thermal conductive composition is positioned substantially between the heat source and the heat sink and provides thermal communication between the heat source and heat sink.

In some embodiments of the heat transfer system comprising the thermal conductive composition, $R_1$ is —C(=O)$OR_2$, —C(=O)$OCH_2$CH(O)$CH_2$, —$NH_2$, $CH_2$=CH—, $CH_2$=CH—$CH_2$—, —Si$(OR_3)_3$, or a reactive siloxane derivative thereof. In some embodiments, $R_1$ is hydroxyl, —C(=O)OH, OCN, or —C(=O)$OR_2$. In some embodiments, $R_1$ is —Si$(OR_3)_3$. In some embodiments, A is N. In some embodiments, A is P. In some embodiments, M is Al or Zn. In some embodiments, X is Cl or I. In some embodiments, Z is chloro. In some embodiments of the heat transfer system, the thermal composition comprises a compound of Formula (I), A is N, M is Zn, X is absent, and the other variables are as above. In some embodiments, $R_1$ is —Si$(OR_3)_3$. In some embodiments, $R_1$ is —OH, —C(=O)$OR_2$, or —OCN.

In some embodiments of the heat transfer system comprising the thermal conductive composition, the thermal conductive composition comprises a siloxane derivative of a compound of Formula (I). In some embodiments, the siloxane derivative is a compound of Formula (II):

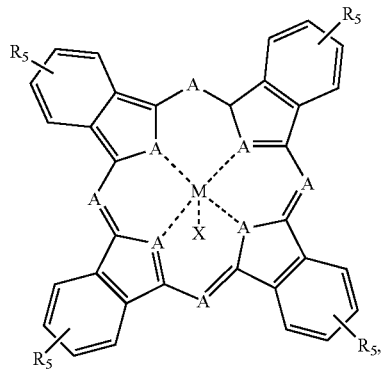

(II)

wherein $R_5$ is: —OCN, or

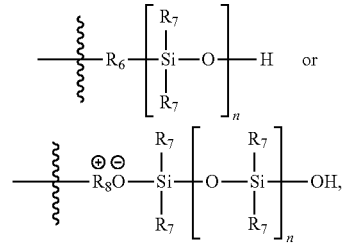

wherein $R_6$ is —C(=O)O—, —C(=O)$OCH_2$C(OH)HCH2-, —$CH_2$C(OH)$HCH_2$—, —NH—, —Si$(R_2)_2$$CH_2$$CH_2$NH—, —Si$(R_2)_2$$CH_2$C(OH)$HCH_2$—, —$CH_2$$CH_2$—, —$CH_2$$CH_2$$CH_2$—, —$CH_2$O—, —$CH_2$—, and $R_8$ is —$N^+$$(R_9)_3$, wherein $R_9$ is $C_1$-$C_6$ alkyl.

In some embodiments of the heat transfer system comprising the thermal conductive composition, the thermal conductive composition is a polyolefin copolymerized or grafted with a compound of Formula (I). In some embodiments, the polyolefin copolymerized or grafted with a compound of Formula (I) has a formula of:

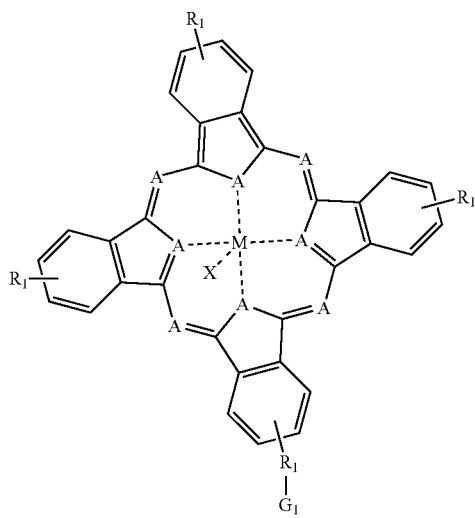

wherein:

$G_1$ is polyalkylene or polyvinyl alcohol;

$R_1$ is $C_1$-$C_6$ alkyl or —COO—;

A is N or P;
M is Al, B, Si, Co, Ni, Zn, or In; and
X is absent, alkyl, or halo.

In some embodiments, the thermal conductive composition present in the heat transfer system has a conductivity of about 10-50 W/mK. In some embodiments, $G_1$ is polypropylene, polyethylene, polymethylpentene, or polybutene.

In some embodiments, an electronic device is provided, wherein the electronic device is at least partially encapsulated by a thermal conductive composition comprising a compound of Formula (I)

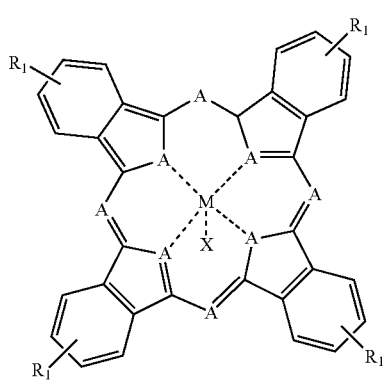

(I)

wherein:
A is N or P;
M is Al, B, Si, Co, Ni, Zn, or In;
X is absent, alkyl, or halo;
$R_1$ is —C(=O)OR$_4$, —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, —OCN, —CH$_2$OH, —CH$_2$Z, CH$_2$OCN, —Si(OR$_3$)$_3$, —N$^+$(CH3)$_3^-$OH, hydroxyl, or any reactive siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

In some embodiments of the electronic device is at least partially encapsulated by a thermal conductive composition comprising a compound of Formula (I), $R_1$ is —C(=O)OR$_2$, —C(=O)OCH$_2$CH(O)CH$_2$, —NH$_2$, CH$_2$=CH—, CH$_2$=CH—CH$_2$—, —Si(OR$_3$)$_3$, or a reactive siloxane derivative thereof.

In some embodiments, $R_1$ is hydroxyl, —C(=O)OH, OCN, or —C(=O)OR$_2$. In some embodiments, $R_1$ is —Si(OR$_3$)$_3$. In some embodiments, A is N. In some embodiments, A is P. In some embodiments, M is Al or Zn. In some embodiments, X is Cl or I. In some embodiments, Z is chloro. In some embodiments of the electronic device that is at least partially encapsulated by a thermal conductive composition comprising a compound of Formula (I), A is N, M is Zn, X is absent, and the other variables can be as described above. In some embodiments, $R_1$ is —Si(OR$_3$)$_3$. In some embodiments, $R_1$ is —OH, —C(=O)OR$_2$, or —OCN.

In some embodiments of the electronic device at least partially encapsulated by a thermal conductive composition comprising a compound of Formula (I), the thermal conductive composition comprises a siloxane derivative of a compound of Formula (I). In some embodiments, the siloxane derivative is a compound of Formula (II):

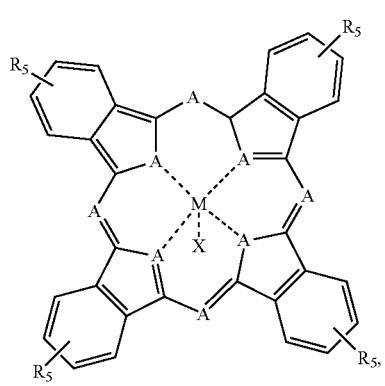

(II)

wherein
$R_5$ is: —OCN, or

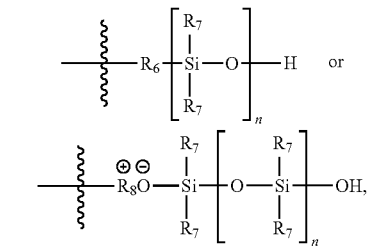

or

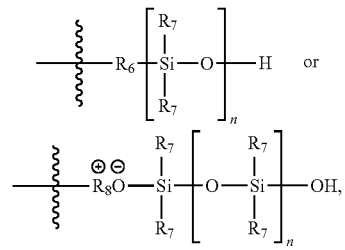

wherein $R_6$ is —C(=O)O—, —C(=O)OCH$_2$C(OH)HCH2-, —CH$_2$C(OH)HCH$_2$—, —NH—, —Si(R$_2$)$_2$CH$_2$CH$_2$NH—, —Si(R$_2$)$_2$CH$_2$C(OH)HCH$_2$—, —CH$_2$CH$_2$—, —CH$_2$CH$_2$CH$_2$—, —CH$_2$O—, —CH$_2$—, and $R_8$ is —N$^+$(R$_9$)$_3$, wherein $R_9$ is $C_1$-$C_6$ alkyl.

In some embodiments of the electronic device is at least partially encapsulated by a thermal conductive composition comprising a compound of Formula (I), the thermal conductive composition is a polyolefin copolymerized or grafted with a compound of Formula (I). In some embodiments, the polyolefin copolymerized or grafted with a compound of Formula (I) has a formula of:

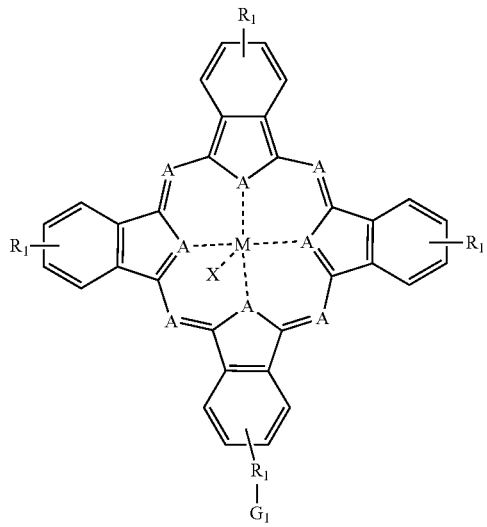

wherein:
$G_1$ is polyalkylene or polyvinyl alcohol;
$R_1$ is $C_1$-$C_6$ alkyl or —COO—;

A is N or P;

M is Al, B, Si, Co, Ni, Zn, or In; and

X is absent, alkyl, or halo. In some embodiments, $G_1$ is polypropylene, polyethylene, polymethylpentene, or polybutene.

In some embodiments, the electronic device is encapsulated by the composition. The type of electronic device can be any device that is suitable to be partially encapsulated or encapsulated by the compositions described herein. Examples of suitable electronic devices include, but are not limited to, a semiconductor chip, a conductive wire, an electronic component, or an electronic circuit.

The compounds described herein can be prepared according to any suitable method and as described in the Examples section below. In some embodiments, a method of preparing a compound of Formula (I) is provided. In some embodiments, the method includes contacting

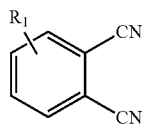

with a metal salt under conditions sufficient to produce a compound of Formula (I)

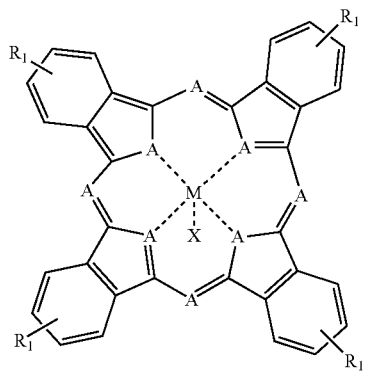

wherein:

A is N;

M is Al, B, Si, Co, Ni, Zn, or In;

X is absent, alkyl, or halo;

$R_1$ is —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.

Z is halo;

$R_2$ is $C_1$-$C_6$ alkyl;

$R_3$ is H, $C_1$-$C_6$ alkyl, or $C_1$-$C_6$ alkenyl; and $R_4$ is H, $C_1$-$C_6$ alkyl, or $C_1$-$C_6$ alkenyl.

In some embodiments, the conditions are heating the reaction in a closed system at temperatures of about 160-200 C.

The conditions and starting materials can be modified in accordance with the end product to be produced. In some embodiments, the metal salt is an Al, B, Si, Co, Ni, Zn, or In salt.

In some embodiments, the method comprising contacting

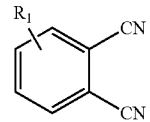

with lithium and an alcohol under conditions sufficient to produce a compound of Formula (IA)

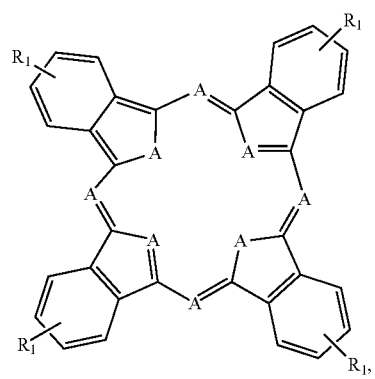

wherein A is N;

$R_1$ is —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN hydroxyl, or a siloxane derivative thereof.

Z is halo;

$R_2$ is $C_1$-$C_6$ alkyl;

$R_3$ is H, $C_1$-$C_6$ alkyl, or $C_1$-$C_6$ alkenyl; and $R_4$ is H, $C_1$-$C_6$ alkyl, or $C_1$-$C_6$ alkenyl.

In some embodiments, the method further comprises contacting the compound of Formula (IA) with a metal salt under conditions sufficient to form a compound of Formula (I)

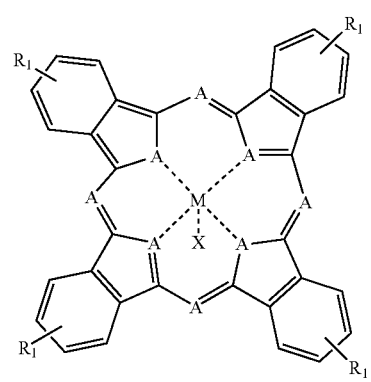

wherein:

A is N;

M is Al, B, Si, Co, Ni, Zn, or In;

X is absent, alkyl, or halo;

$R_1$ is —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.

Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl.

In some embodiments, the metal salt is an Al, B, Si, Co, Ni, Zn, or In salt.

In some embodiments, the methods described herein are modified to yield the different species that are desired to be produced. The procedures described in "Phthalocyanine materials-synthesis, structure and functions" Neil B. McKowown, Cambridge university 1998, can be modified based upon the present disclosure to yield the compounds and compositions described herein.

In some embodiments, the method comprises contacting a substituted phthalic anhydride with a metal salt in the presence of urea at temperatures of about 160-200 C. In some embodiments, the method includes refluxing the product with pyridine and pyridine hydrochloride for about 10-48 h to obtain metal free phthalocyanine. In some embodiments, the metal free complex can be transferred to any metal phthalocyanine by contacting with its salt as shown, for example, in Example 11.

In some embodiments, the method comprises contacting substituted phthalic anhydride with a metal salt in the presence of urea at temperatures of about 160-200 C. A non-limiting scheme is shown below.

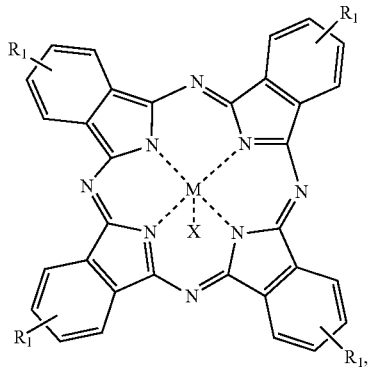
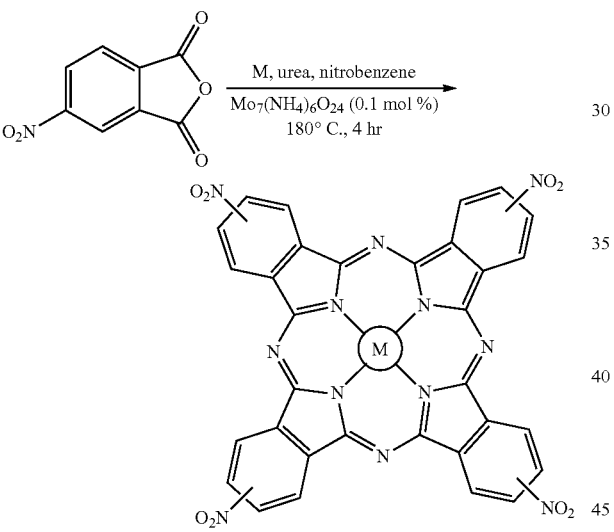

wherein, M is Al, B, Si, Co, Ni, Zn, or In.

Methods of Preparing a Compound of Formula (III)

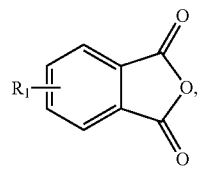

(III)

wherein
M is Al, B, Si, Co, Ni, Zn, or In;
X is absent, alkyl, or halo;
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl are also provided. In some embodiments, the method includes contacting a compound of formula

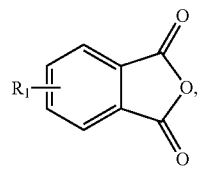

wherein
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.
Z is halo;
$R_2$ is $C_1$-$C_6$ alkyl;
$R_3$ is H, $C_1$-$C_6$ alkyl, or $C_1$-$C_6$ alkenyl; and
$R_4$ is H, $C_1$-$C_6$ alkyl, or $C_1$-$C_6$ alkenyl,
with urea, the metal M, wherein M is Al, B, Si, Co, Ni, Zn, or In, and nitrobenzene under conditions sufficient to produce the compound of Formula (III). In some embodiments $R_1$ is NO$_2$, CH$_3$, NH$_2$, or CH$_2$=CH—CO—NH—. In some embodiments, the method is performed in the presence of Mo$_7$(NH$_4$)$_6$O$_{24}$.

Methods of preparing a metal-free phthalocyanine are also provided. In some embodiments, the method comprises contacting a compound a metal-phthalocyanine of Formula (III)

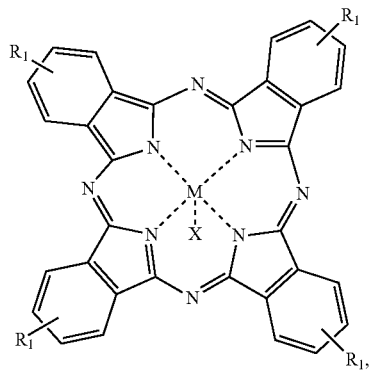

(III)

wherein
M is Al, B, Si, Co, Ni, Zn, or In;
X is absent, alkyl, or halo;
$R_1$ is —C(=O)O$R_2$, —C(=O)OCH$_2$CH(O)CH2, —CH$_2$CH(O)CH$_2$, —NH$_2$, —Si(O$R_2$)$_3$, —Si($R_2$)$_2$CH$_2$CH$_2$NH$_2$, —Si($R_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.

Z is halo;
R$_2$ is C$_1$-C$_6$ alkyl;
R$_3$ is H, C$_1$-C$_6$ alkyl, or C$_1$-C$_6$ alkenyl; and
R$_4$ is H, C$_1$-C$_6$ alkyl, or C$_1$-C$_6$ alkenyl,
with pyridine hydrochloride to form a compound a metal-free phthalocyanine of Formula (IV)

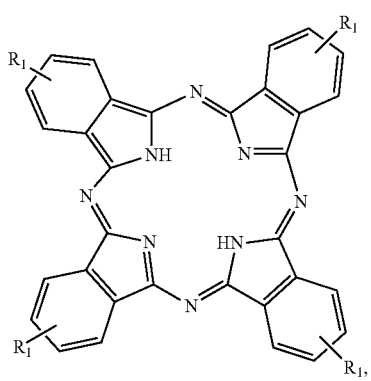

(IV)

wherein
R$_1$ is —C(=O)OR$_2$, —C(=O)OCH$_2$CH(O)CH2, —CH$_2$CH(O)CH$_2$, —NH$_2$, —Si(OR$_2$)$_3$, —Si(R$_2$)$_2$CH$_2$CH$_2$NH$_2$, —Si(R$_2$)$_2$CH$_2$CH(O)CH$_2$, —CH=CH$_2$, —CH$_2$CH=CH$_2$, —CH=CH—CN, OCN, —CH$_2$OH, —CH$_2$Z, CH$_2$OCN, hydroxyl, or a siloxane derivative thereof.

Z is halo;
R$_2$ is C$_1$-C$_6$ alkyl;
R$_3$ is H, C$_1$-C$_6$ alkyl, or C$_1$-C$_6$ alkenyl; and
R$_4$ is H, C$_1$-C$_6$ alkyl, or C$_1$-C$_6$ alkenyl.
In some embodiments, M is Zn. In some embodiments, R$_1$ is NH$_2$. In some embodiments, the method is performed at a temperature of about 100-150 C.

EXAMPLES

Example 1: Preparation of Tetra Amino Zinc Phthalocyanine

Tetra amino zinc phthalocyanine is prepared from tetra nitro zinc phthalocyanine according to the reported procedure (Cong, F.-D. N., Bo; Du, Xi-Guang; Ma, Chun-Yu; Yu, Hai-Feng; Chen, Bin *Dyes and Pigments* 2005, 66, 149.) and as following: A five necked flanged top reaction vessel (500 mL) equipped with mechanical stirrer, thermometer, and condenser is charged with 150 mL of nitrobenzene, 3.83 g of zinc chloride, 30 g urea and 20 g of 4-nitrophthalic anhydride. The reaction mixture is flashed with nitrogen. 130 mg of ammonium molybdate is added to the solution mixture. The reaction is carried out with continuous stirring under nitrogen at 185° C. for four hours then the reaction mixture is cooled to ambient temperature. The product is precipitated by addition of 250 mL toluene portion wise with continuous cooling. The resulting precipitate is separated and washed with toluene, water, and MeOH/ether (1:9), ethyl acetate/hexane (2:1), and dried to afford a dark green solid (20 g, yield 98%).

The tetra nitrozincphathalocyanine is reduced to the amino derivative as following:

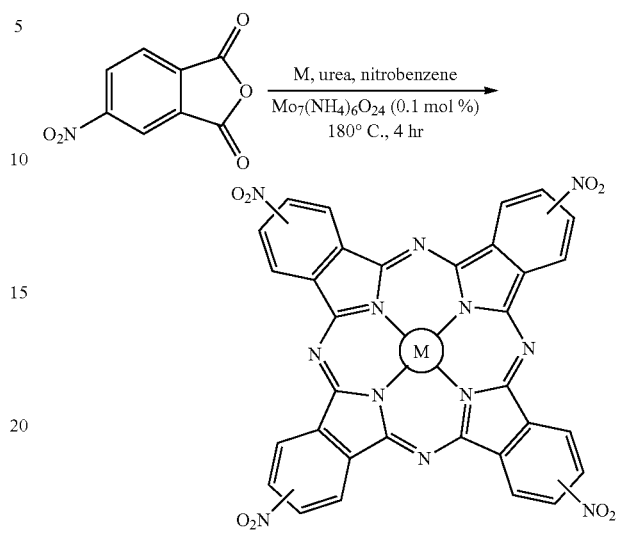

Tetramino-zinc-phthalocyanine is prepared according to the modified published procedure. The reaction vessel is charged with 19.5 g of tetra nitro zinc phthalocyanine previously prepared, 150 mL of DMF, mixed under nitrogen for 10 minutes then 74 g of Na2S9.H20 is added to the solution. The reaction mixture is stirred under N2 and heated at 60° C. After 1.5 hours, the mixture is cooled to ambient temperature, diluted with ice water (350 mL). The precipitate is separated and washed with MeOH/ether (1:9) several times and then with ethyl acetate. The precipitate is dried under vacuum at 80° C. to obtain a dark colored product. The scheme for the preparation is shown below.

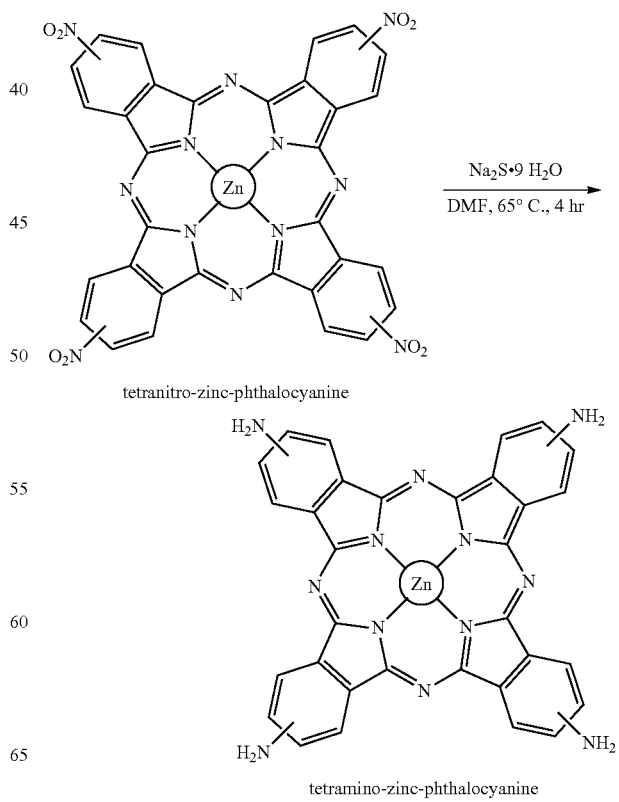

Example 2: Preparation of Tetra Amino Aluminium Phthalocyanine

A five necked flanged top reaction vessel (500 mL) equipped with mechanical stirrer, thermometer, and condenser is charged with 150 mL of nitrobenzene, 3.72 g of $AlCl_3$, 30 g urea and 20 g of 4-nitrophthalic anhydride. The reaction mixture is flashed with nitrogen. 130 mg of ammonium molybdate is added to the solution mixture. The reaction is carried out with continuous stirring under nitrogen at 185° C. for four hours then the reaction mixture is cooled to ambient temperature. The product is precipitated by addition of 250 mL toluene portion wise with continuous cooling.

The resulting precipitate is separated, washed with toluene, water, MeOH/ether (1:9), and finally is washed with ethyl acetate/hexane (2:1), and dried to give a solid product.

The tetra nitro aluminium phthalocyanine is reduced to the amino derivative as following. The reaction vessel is charged with 15 g of tetra nitro aluminium phthalocyanine previously prepared, 150 mL of DMF, mixed under nitrogen for 10 minutes then 74 g of $Na_2S\ 9.H_2O$ is added to the solution. The reaction mixture is stirred under $N_2$ and heated at 60° C. After 6 h, the mixture is cooled to ambient temperature, and diluted with ice water (350 mL). The precipitate is separated and washed with MeOH/ether (1:9) several times and followed by an ethyl acetate wash. The precipitate is dried under vacuum at 80° C. to obtain a dark colored product. The obtained product can be used as a curing agent to epoxy resin, and as crosslinking agent to polyurethane and siloxane polymers.

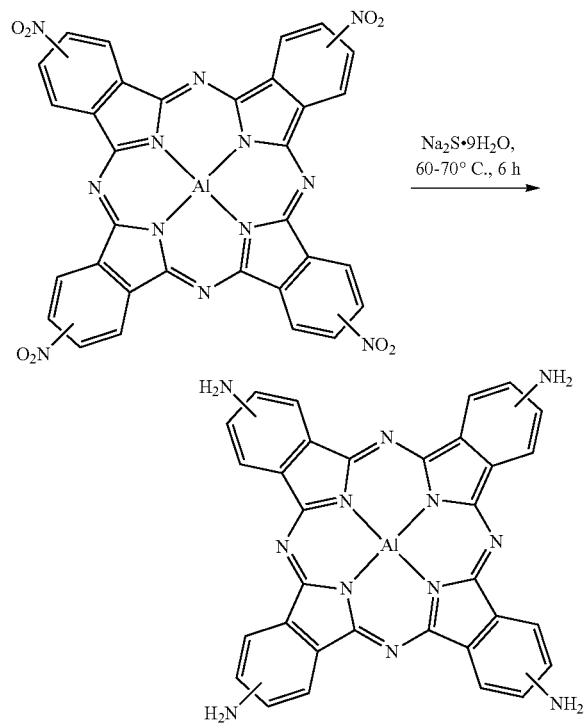

Example 3: Preparation of Tetra Amino Silicon Phthalocyanine Thermal Conductive Ingredient A five necked flanged top reaction vessel (500 mL) equipped with mechanical stirrer, thermometer, and condenser is charged with 150 mL of nitrobenzene, 4.16 g (26 mmol) of $CH_3SiCl_3$, 30 g urea, and 20 g of 4-nitrophthalic anhydride. The reaction mixture is flashed with nitrogen. 130 mg of ammonium molybdate is added to the solution mixture. The reaction is carried out with continuous stirring under nitrogen at 185° C. for four hours, then the reaction mixture is cooled to ambient temperature. The product is precipitated by addition of 250 mL toluene portion-wise with continuous cooling. The resulting precipitate is separated and washed with toluene, water, MeOH/ether (1:9), and finally is washed with ethyl acetate/hexane (2:1), and dried to afford a dark solid product. The tetra nitro silicone phthalo cyanine is reduced to the amino derivative as following:

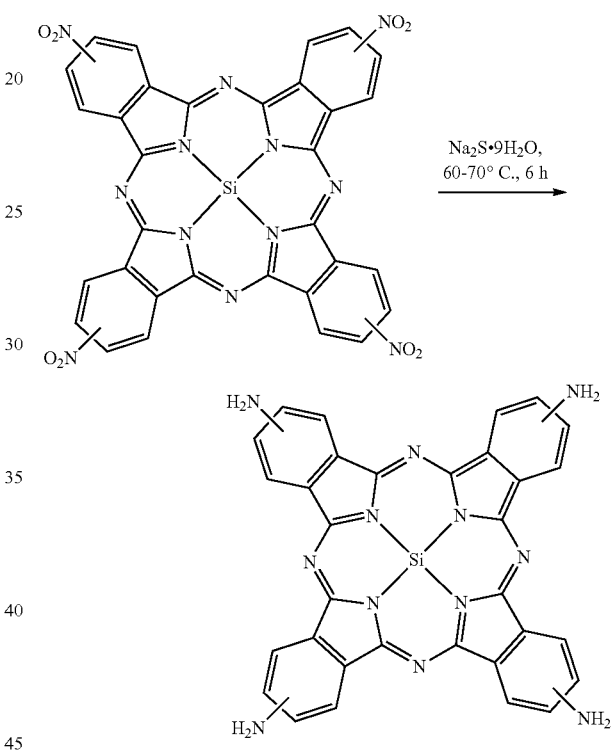

The reaction vessel is charged with 16.5 g of tetra nitro silicon phthalocyanine previously prepared, 150 mL of DMF, and mixed under nitrogen for 10 minutes. 74 g of $Na_2S\ 9.H_2O$ is added to the solution. The reaction mixture is stirred under $N_2$ and heated at 60° C. After 6 hours, the mixture is cooled to ambient temperature and ice water (350 mL) is added. The precipitate is separated and washed with MeOH/ether (1:9) several times and followed by an ethyl acetate wash, and then dried under vacuum at 80° C. to obtain a dark colored product to be used as thermal conductive ingredient.

Example 4: Preparation of Tetra Methyl Zinc Phthalocyanine (a Graftable Thermal Conductive Ingredient)

Tetra methyl zinc phthalocyanine can be prepared according to the scheme below.

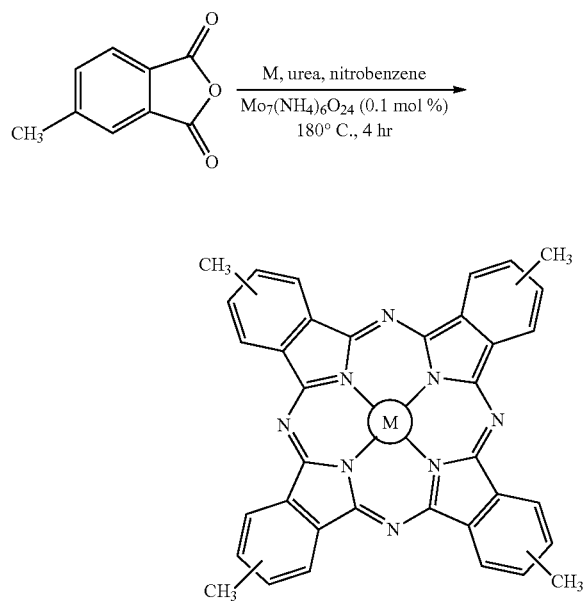

A five necked flanged top reaction vessel (500 mL) vessel equipped with mechanical stirrer, thermometer, and condenser is charged with 150 mL of nitrobenzene, 3.83 g of zinc chloride, 30 g urea, and 20 g of 4-nitrophthalic anhydride. The reaction mixture is flashed with nitrogen. 130 mg of ammonium molybdate is added to the solution mixture. The reaction is carried out with continuous stirring under nitrogen at 185° C. for four hours then the reaction mixture is cooled to ambient temperature. The product is precipitated by addition of 250 mL toluene portion-wise with continuous cooling.

The resulting precipitate is separated. The thermal conductive active ingredient is grafted onto commercial polymers as described herein.

Example 5: Preparation of Thermal Conductive Polymerizable Tetra Acrylamide Aluminiumphthalocyanine Tetra acrylamide aluminium phthalocyanine is prepared according to the following scheme.

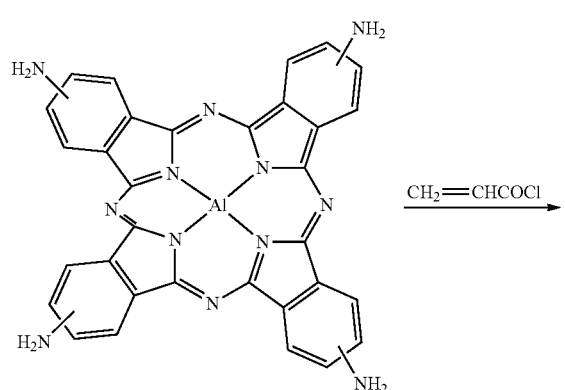

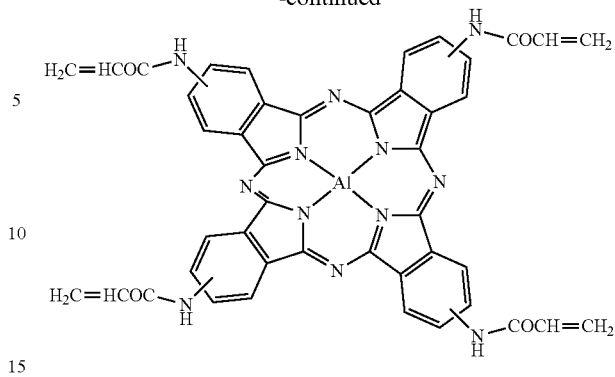

The polymerizable acrylamide can also be prepared according to the following scheme adopting the procedure shown in Example 1 in the presence benzoquinone retarder to prevent polymerization in situ.

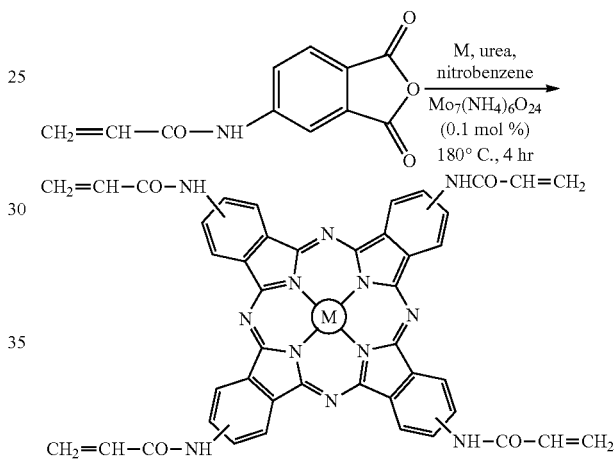

A five necked flanged top reaction vessel equipped with mechanical stirrer, thermometer, nitrogen inlet tube, and condenser guarded with drying tube filled calcium chloride, and separating funnel immersed is placed in a cooling water. The reaction vessel is charged with 20 g of tetra aminoaluminum phthalocyanine, 150 mL methylene chloride, and 50 mL redistilled pyridine. The separating funnel is charged with 50 g acryloyl chloride which is added portion wise with continuous mixing to the reaction mixture. When the addition is completed the reaction is continued for one hour. At the end of the reaction time the reaction mixture is poured over 200 g ice water with efficient mixing to precipitate the product. The precipitate is separated and can be used in the production of thermal conductive gels.

Example 6: Preparation of Tetrahydroxy Aluminium Phthalocyanine as Thermal Conductive Reactive Intermediate A fusion reactor is charged with 50 g hydroxyl phenyldinitrile and 12 g of anhydrous $AlCl_3$. Several steel balls are added to mix the mixture. The reactor is sealed and heated to 250 C with mixing for 3 hours. The bulk reactor is cooled to ambient temperature. The product is washed with MeOH/ ether (1:9) several times followed by an ethyl acetate wash and then dried under vacuum at 80° C. to obtain a dark colored product. The product can be used as an active ingredient for preparation of several polymerizable ingredients.

Example 7: Preparation of Aluminium Phthalocyanate Tetra Acrylate

Aluminium phthalocyanate tetra acrylate can be prepared according to the following scheme:

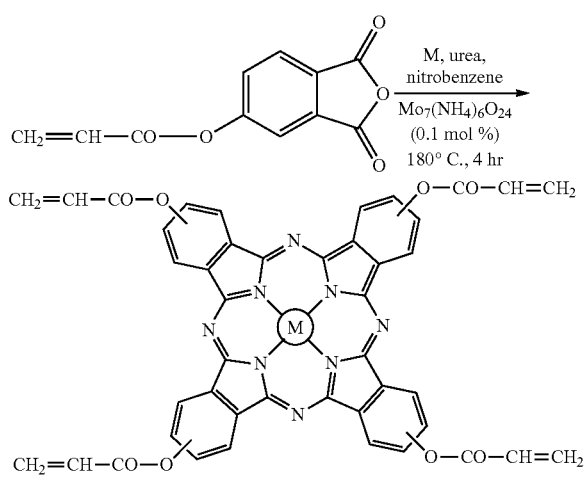

A reaction vessel immersed in a water bath at 30 C is charged with 100 mL of pyridine, 20 g of tetra hydroxyl aluminium phthalocyanine (see Example 6), and mixed. 145 ml of acryloyl chloride is added from a dropping funnel with continuous mixing. The reaction is carried out under dry conditions. At the end of addition the reaction is continued for one hour. The reaction product is poured over 250 g of ice/water with mixing. The hydrolyzed acryloyl chloride is extracted with 10% sodium carbonate. The product is washed with MeOH/ether (1:9) several times, followed with an ethyl acetate wash, and dried under vacuum at 50° C. over night to obtain dark colored product, which can be used in the preparation of a thermal conductive polyacrylate (see Example 8).

Example 8: Preparation of Thermal Conductive Aluminium Phthalocyanine Polyacrylate 10 g of tetra acrylo aluminium phthalocyanate (see Example 7) is dissolved in 90 g of methylmethacrylate and 0.2 g of benzoyl peroxide mixed gently and poured over an electric circuit in a mold. The product is polymerized in oven at 80 C overnight. The thermal conductivity of the encapsulated product is evaluated via DSC and break down voltage.

Example 9: Preparation of Thermal Conductive Polycarbonate

A five neck flanged top reaction vessel (500 mL) equipped with mechanical stirrer, thermometer, dropping funnel nitrogen inlet tube, and condenser immersed in oil bath at 120 C is charged with 150 mL DMF, 70 ml pyridine, 10 g of terahydroxy aluminium phthalocyanine, 66 g of analar grad bisphenol –A, and 30 g diphenyl carbonate. The reaction mixture is heated to 115-120 C for 3 hours under nitrogen atmosphere. The formed phenol is distilled off. At the end of the reaction the product is cooled to ambient temperature. The mixture is poured over 250 g of ice water with mixing. The formed polycarbonate is precipitated and washed with water several times, and dried under vacuum at 80 C.

Example 10: Preparation of Thermal Conductive Tetracyanate Aluminium Phthalocyanine Tetracyanate aluminium phthalocyanine can be prepared according to the following scheme:

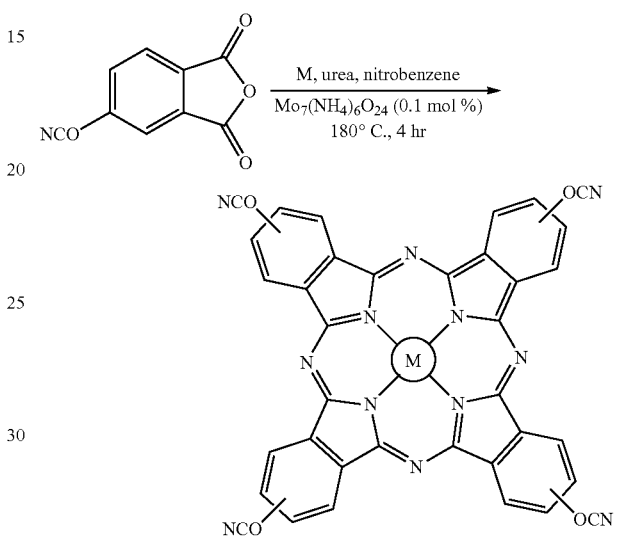

The procedure described in Example 1 is used. The product is mixed with 90% (w/w) of commercial phenolic resin. The product is cured by thermal curing heating at 160 C to form thermal conductive thermoset resin.

Example 11: Preparation of Metal-Free Tetra Amino Phthalocyanine

Metal-free tetra amino phthalocyanine can be prepared by modifying the procedure described in Alzeer, et al., Chem. Commun. 15: 1970-1971 (2009).

The metal-free tetra amino phthalocyanine can be prepared according to the following scheme:

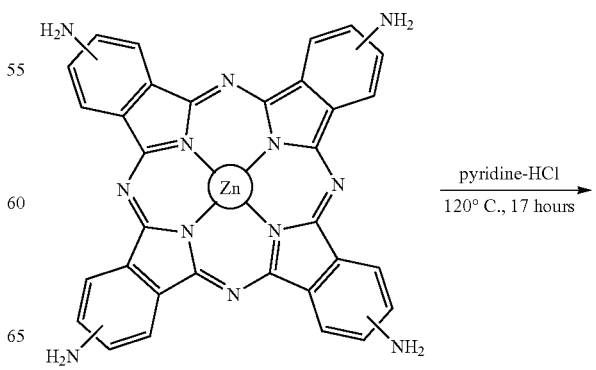

-continued

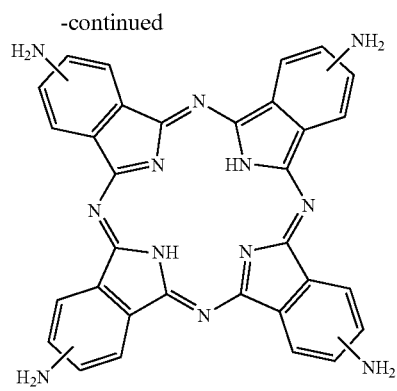

The reaction vessel fitted with condenser, stirrer, immersed in oil bath at 110 C is charged with 3.5 g tetra amino zinc phthalocyanine, 20 mL pyridine, and 10 g pyridine hydrochloride, and stirred to reflux under nitrogen atmosphere for 24 hours. At the end of reaction time the product is cooled to ambient temperature. The product is added portion-wise to 100 g cold water with vigorous mixing. The precipitate is washed with water several times, then with distilled water, methanol, and ethylacetate, and then dried under vacuum. The product can be transferred to any other metal phthalocyanine complex as alternative procedure.

Example 12: Preparation of Thermal Conductive Polyurethane

Equivalent weights from the two components of polyurethane (toluene diisocyanate) and polyether polyol) are mixed with 5% by weight from the tetra amino zinc phthalocyanine and mixed gently. An electric circuit is placed in the mold. The polyurethane mixture is poured on the circuit to encapsulate it. The thermal conductivity is measured via differential scanning calorimetry, DSC and via measuring the break down voltage.

Example 13: Preparation of Thermal Conductive Epoxy Resins 25 g of commercial epoxy resin is mixed gently with equivalent weight of tetra amino zinc phthalocyanate. An electric circuit is immersed in the resin for encapsulation. The sample is cured over night at room temperature then post-cured at 60 C for 3 hours. The thermal conductivity is evaluated via measuring the break down voltage.

Example 14: Preparation of Thermal Conductive Polypropylene by Grafting the Thermal Conductive Ingredient 100 g of poly propylene is mixed with five grams of tetra methyl aluminium phthalocyanine (see Example 4) and 0.02 g from di t-butyl peroxide and extruded via reactive extruder to graft the thermal conductive ingredient. The extruded melt is used for encapsulation of an electric circuit. The thermal conductivity of the extruded polymer is measured by DSC and break down voltage.

Example 15: Preparation of Thermal Conductive Rubber for Puncher Less Tire 10 g of tetra-acrylate zinc phthalocyanine (see Example 7) is copolymerized with 90 g butadiene in the presence of 0.05% by weight benzoyl peroxide and heated in sealed reaction tube under vacuum at 80 C for 16 hours. The formed polybutadiene is characterized via DSC to measure the thermal conductivity.

The Examples demonstrate that the compositions described herein can function as thermal conductive materials with superior and unexpected properties. The materials allow for new uses that have not been possible prior to the present embodiments.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

What is claimed is:

1. A thermal conductive composition comprising a compound of Formula (I):

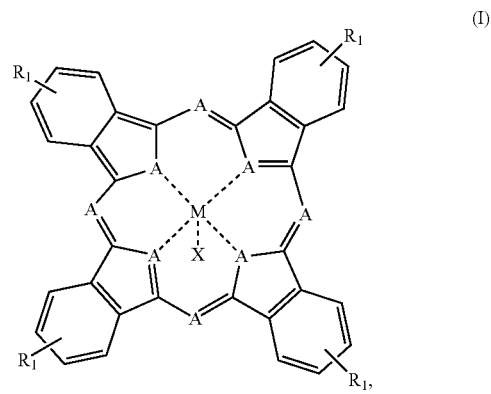

wherein:
A is N;
M is Al;
X is absent; and
$R_1$ is —OCN or hydroxyl.

2. The thermal conductive composition of claim 1, wherein $R_1$ is hydroxyl.

3. The thermal conductive composition of claim 1, wherein $R_1$ is —OCN.

4. A thermal conductive composition of Formula (II):

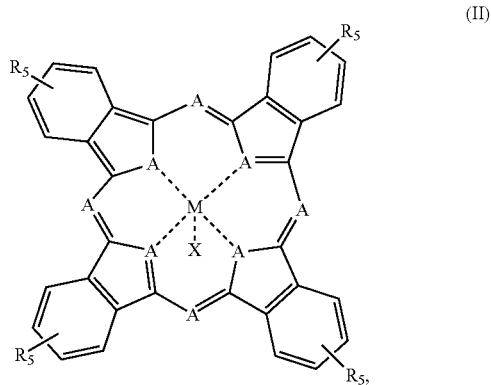

wherein
A is N or P;
M is Al, B, Si, or In;
X is absent, alkyl, or halo; and
$R_5$ is —OCN.

5. A heat sink comprising a compound of Formula (I):

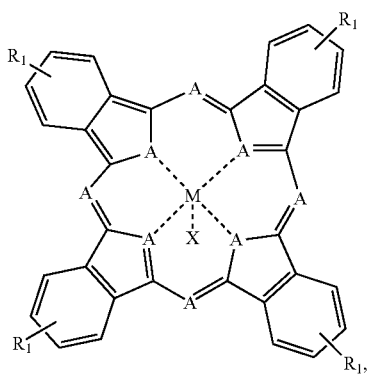

wherein:
A is N;
M is Al;
X is absent; and
$R_1$ is —OCN or hydroxyl.

6. The heat sink of claim 5, wherein $R_1$ is hydroxyl.

7. The heat sink of claim 5, wherein $R_1$ is —OCN.

8. A heat transfer system or an electronic device, wherein the heat transfer system comprises:
at least one heat source;
at least one heat sink; and
at least one thermal conductive composition comprising a compound of Formula (I):

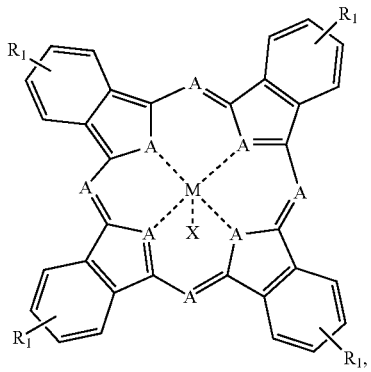

wherein:
A is N;
M is Al;
X is absent; and
$R_1$ is —OCN or hydroxyl,
wherein at least a portion of the at least one thermal conductive composition is positioned substantially between the at least one heat source and the at least heat sink, and provides thermal communication between the at least one heat source and the at least one heat sink; or wherein
the electronic device is at least partially encapsulated by the at least one thermal conductive composition comprising the compound of Formula (I):

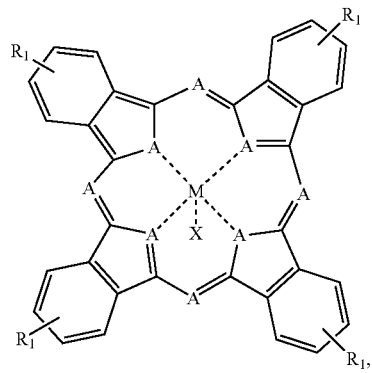

wherein:
A is N;
M is Al;
X is absent; and
$R_1$ is —OCN or hydroxyl.

9. The electronic device of claim 8, wherein the electronic device is encapsulated by the at least one thermal conductive composition.

10. A method of preparing a compound of Formula (I), the method comprising:
contacting

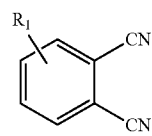

with a metal salt under conditions sufficient to produce the compound of Formula (I):

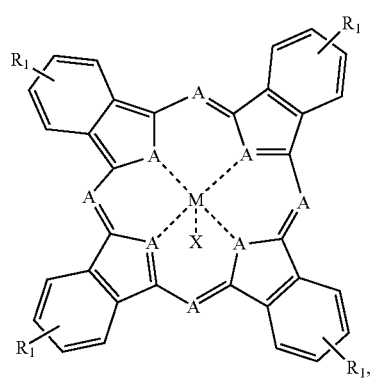

wherein:
A is N;
M is Al;
X is absent; and
$R_1$ is OCN or hydroxyl;
or
the method of preparing the compound of Formula (I), the method comprising:

a) contacting

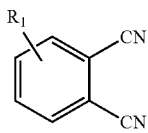

with lithium and an alcohol under conditions sufficient to produce a compound of Formula (IA):

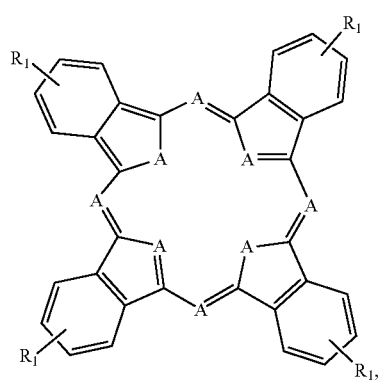

wherein A is N; and
R$_1$ is —OCN or hydroxyl;
and b) contacting the compound of Formula (IA) with the metal salt under conditions sufficient to form the compound of Formula (I):

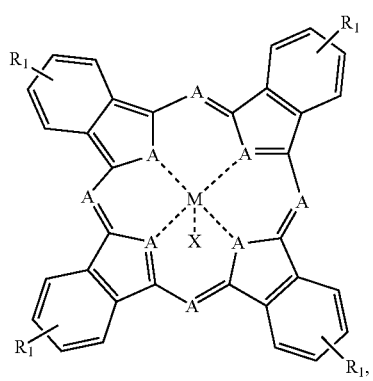

wherein:
A is N;
M is Al;
X is absent; and
R$_1$ is —OCN or hydroxyl;
or a compound of Formula (III):

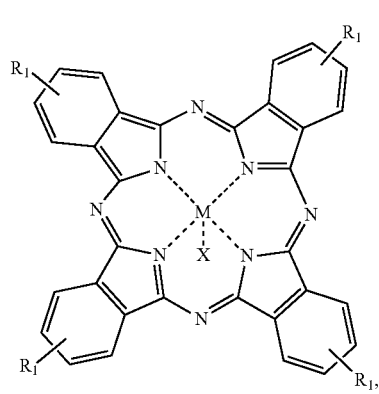

wherein
M is Al;
X is absent; and
R$_1$ —OCN or hydroxyl,
the method comprising: contacting
a compound of formula

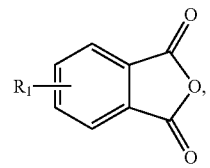

wherein
R$_1$ is —OCN or hydroxyl,
with urea, the metal M, wherein M is Al, and nitrobenzene under conditions sufficient to produce the compound of Formula (III); or
metal-free phthalocyanine, the method comprising contacting a metal-phthalocyanine of Formula (III):

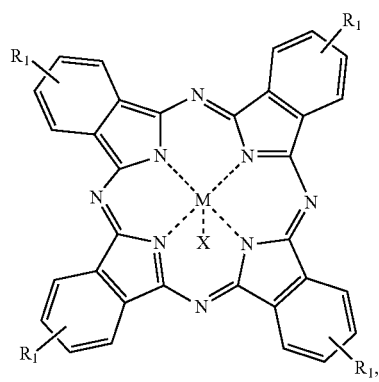

wherein
M is Al;
X is absent; and
R$_1$ is —OCN or hydroxyl,
with pyridine hydrochloride to form a metal-free phthalocyanine of Formula (IV):

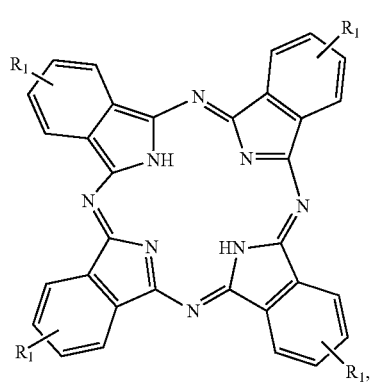
(IV)
wherein
R₁ is —OCN or hydroxyl.
* * * * *